(12) United States Patent
Chen

(10) Patent No.: US 7,131,021 B2
(45) Date of Patent: Oct. 31, 2006

(54) APPARATUS FOR DELAY CALIBRATION OF A FORWARD CLOCK USING THREE FEEDBACK CLOCKS AND A STATE TRANSITION TABLE

(75) Inventor: Chien-Ming Chen, Zhanghua (TW)

(73) Assignee: Faraday Technology Corp., Hsin-Chu (TW)

( * ) Notice: Subject to any disclaimer, the term of this patent is extended or adjusted under 35 U.S.C. 154(b) by 199 days.

(21) Appl. No.: 10/315,154

(22) Filed: Dec. 10, 2002

(65) Prior Publication Data

US 2004/0111650 A1    Jun. 10, 2004

(51) Int. Cl.
*G06F 1/12* (2006.01)

(52) U.S. Cl. .................. 713/401; 327/158; 327/159

(58) Field of Classification Search ............... 327/158, 327/159; 365/233; 713/401
See application file for complete search history.

(56) References Cited

U.S. PATENT DOCUMENTS 5,920,518 A * 7/1999 Harrison et al. ............ 365/233
6,119,242 A * 9/2000 Harrison ..................... 713/503
6,304,116 B1 * 10/2001 Yoon et al. ................. 327/158
6,326,826 B1 * 12/2001 Lee et al. ................... 327/161

* cited by examiner

*Primary Examiner*—Thomas Lee
*Assistant Examiner*—Albert Wang
(74) *Attorney, Agent, or Firm*—Winston Hsu

(57) ABSTRACT

An apparatus for automatic delay calibration of a forward clock. According to the invention, the apparatus includes control logic to receive a normal clock, a lead clock and a lag clock. The control logic therefore generates a delay control signal based on a timing relationship among the normal, the lead and the lag clocks. The apparatus also includes a delay calibrator to receive a reference clock having the same frequency as the forward clock. The delay calibrator generates the lead, the phase lag and the normal clocks from the reference clock and provides them as feedback to the control logic. According to the delay control signal, the delay calibrator can adjust the lead and the lag clocks. Once the timing relationship meets a predetermined condition, the delay control signal is provided to calibrate a delay for the forward clock.

9 Claims, 3 Drawing Sheets

APPARATUS FOR DELAY CALIBRATION OF A FORWARD CLOCK USING THREE FEEDBACK CLOCKS AND A STATE TRANSITION TABLE

BACKGROUND OF THE INVENTION

1. Field of the Invention

The invention relates to integrated circuits. More particularly, the invention relates to an apparatus for delay calibration of a forward clock for use in data capture at a receiving end.

2. Description of the Related Art

As operating speeds of processors and computer systems increase, communication between components such as memories and I/O devices must increase to reduce or eliminate bottleneck problems. One solution to this communications problem is to provide a source-synchronous environment in which components of a system operate. A source-synchronous timing architecture, also called clock forwarding, sends a forward clock or strobe signal along with data. The forward clock is then used to capture the data at receiving end. In a source-synchronous environment, data transfers may occur on both edges of the forward clock and therefore may have a higher transfer rate than other systems.

To capture the data in a register using the forward clock, the forward clock needs to be delayed to satisfy the data setup time requirement of the register. For 100 MHz memory devices, the required delay time is approximately ¼ period of the forward clock, i.e. 2.5 nsec. In general, delay elements are used to provide proper delay for clocking the data into a register. A prior art scheme programs an adjustable delay element at the factory so that the adjustable delay element may delay a forward clock by a fixed interval in aftertime. However, delay elements tend to have drift due to heat, aging, and other environmental factors. It is unfortunate that the prior art cannot compensate for these variations after shipping so the data setup time requirement may be unsatisfied. This causes the forward clock to clock the data into the register incorrectly.

Therefore, what is needed is a novel technique for automatic calibration delay of the forward clock.

SUMMARY OF THE INVENTION

It is an object of the present invention to provide an apparatus to calibrate a delay element automatically, thereby allowing the delay element to operate independently of aging, temperature sensitivity and process variations to offer proper delay for a forward clock.

The present invention is generally directed to an apparatus for delay calibration of a forward clock. According to one aspect of the invention, the apparatus includes control logic and a delay calibrator. The control logic receives a normal clock, a lead clock and a lag clock, and generates a delay control signal based on a timing relationship among the normal clock, the lead clock and the lag clock. The delay calibrator receives a reference clock having the same frequency as the forward clock to provide the normal, the lead and the lag clocks as feedback to the control logic. In accordance with the delay control signal, the delay calibrator is capable of adjusting the lead and the lag clocks. Once the timing relationship has been adjusted to meet a predetermined condition, the delay control signal is provided to perform a delay calibration for the forward clock.

According to another aspect of the invention, an apparatus for delay calibration of a forward clock is disclosed. The apparatus includes control logic to receive a normal clock, a lead clock and a lag clock, and to generate a delay control signal based on a state transition table. Preferably, the state transition table has a set of present states, a set of prior states, a set of prior actions and a set of next actions. Each of the present states is defined by a currently received timing relationship among the normal, the lead and the lag clocks. Each of the prior states is defined by a previously received timing relationship among the normal, the lead and the lag clocks. Each of the prior actions is indicative of a prior adjustment for the delay control signal. Moreover, each of the next actions is indicative of a next adjustment for the delay control signal. Notably, the control logic determines the next action from the state transition table based on the present state, the prior state and the prior action, thereby adjusting the delay control signal. It either increments or decrements a count as the delay control signal depending on whether the next adjustment is to count up or count down the delay control signal. The apparatus also includes a delay calibrator coupled to the control logic. The delay calibrator receives a reference clock having the same frequency as the forward clock to provide the normal, the lead and the lag clocks as feedback to the control logic. It is used to delay the lead and the lag clocks by an adjustable interval according to the delay control signal.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
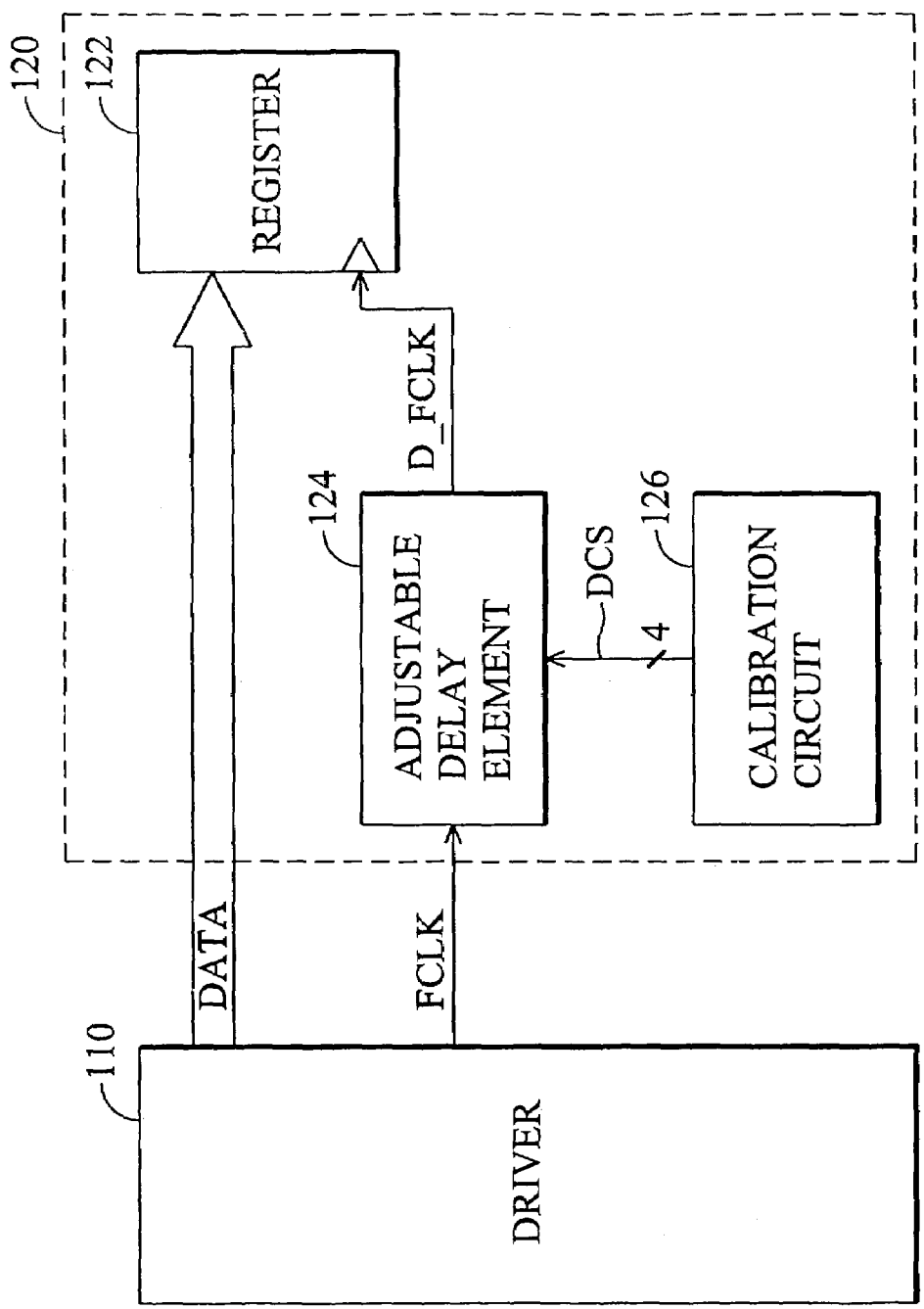
FIG. 1 is a block diagram illustrating a system in which one embodiment of the invention can be practiced.

Referring to FIG. 1, a driver 110 sends a forward clock FCLK in parallel with data to capture the data at a receiver 120. In the receiver 120, an adjustable delay element 124 delays the FCLK signal to meet the data setup time requirement of a register 122. The adjustable delay element 124 provides a desired delay for the FCLK signal under control of a delay control signal DCS from a calibration circuit 126. The clock input of the register 122 is connected to the output of the delay element 124. In this manner, the FCLK signal goes through the delay element 124 to become a delayed forward clock D_FCLK for clocking the data into the register 122.

Figure 2:
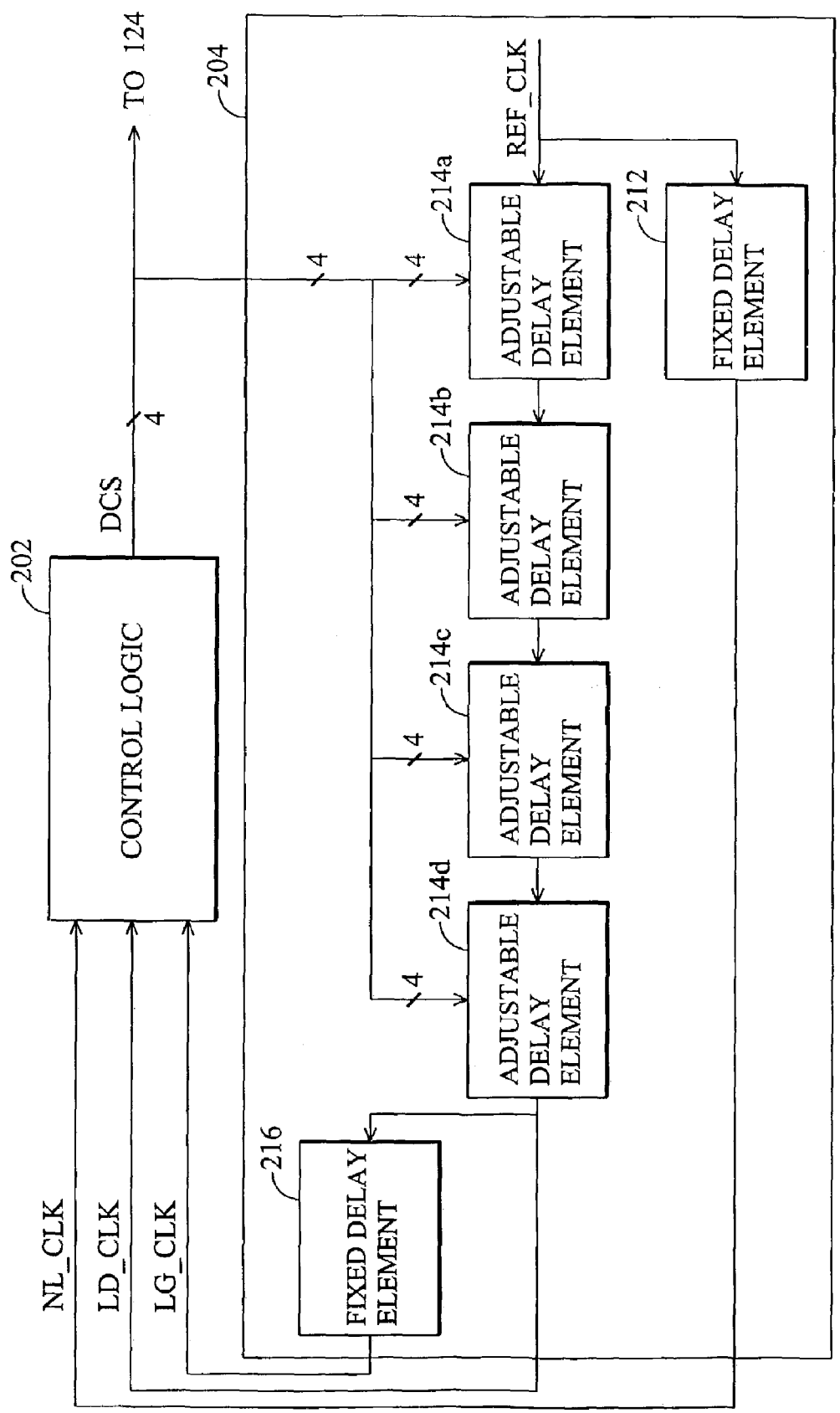
FIG. 2 is a block diagram of a preferred embodiment in accordance with the invention.

FIG. 2 illustrates a more detailed block diagram of the calibration circuit 126 according to the invention. The calibration circuit 126 includes control logic 202 and a delay calibrator 204. The control logic 202 receives a normal clock NL_CLK, a lead clock LD_CLK and a lag clock LG_CLK, and generates the delay control signal DCS based on a timing relationship among the NL_CLK signal, the LD_CLK signal and the LG_CLK signal. The delay calibrator 204 is coupled to the control logic 202. The delay calibrator 204 receives a reference clock REF_CLK having the same frequency as the forward clock FCLK to provide the NL_CLK, the LD_CLK and the LG_CLK signals as feedback to the control logic 202. It is used to delay the LD_CLK and the LG_CLK signals by an adjustable interval according to the DCS signal.

In one embodiment, the delay calibrator 204 is composed of four adjustable delay elements 214a~214d and two fixed delay elements 212 and 216. The REF_CLK signal is fed to the fixed delay element 212 and the adjustable delay element 214a, respectively. The fixed delay element 212 delays the REF_CLK signal by a first delay time and outputs the delayed signal as the NL_CLK signal. As illustrated in FIG. 2, the adjustable delay elements 214a~214d are connected in cascade to form a chain. Each of the delay elements 214a~214d has an adjustable delay time controlled by the DCS signal. The REF_CLK signal goes through the delay elements 214a~214d by a sum of the adjustable delay times to become the LD_CLK signal. The fixed delay element 216 is connected in cascade to the adjustable delay element 214d to further delay the LD_CLK signal as the LG_CLK signal by a second delay time. Preferably, the second delay time is twice as long as the first delay time.

Figure 3:
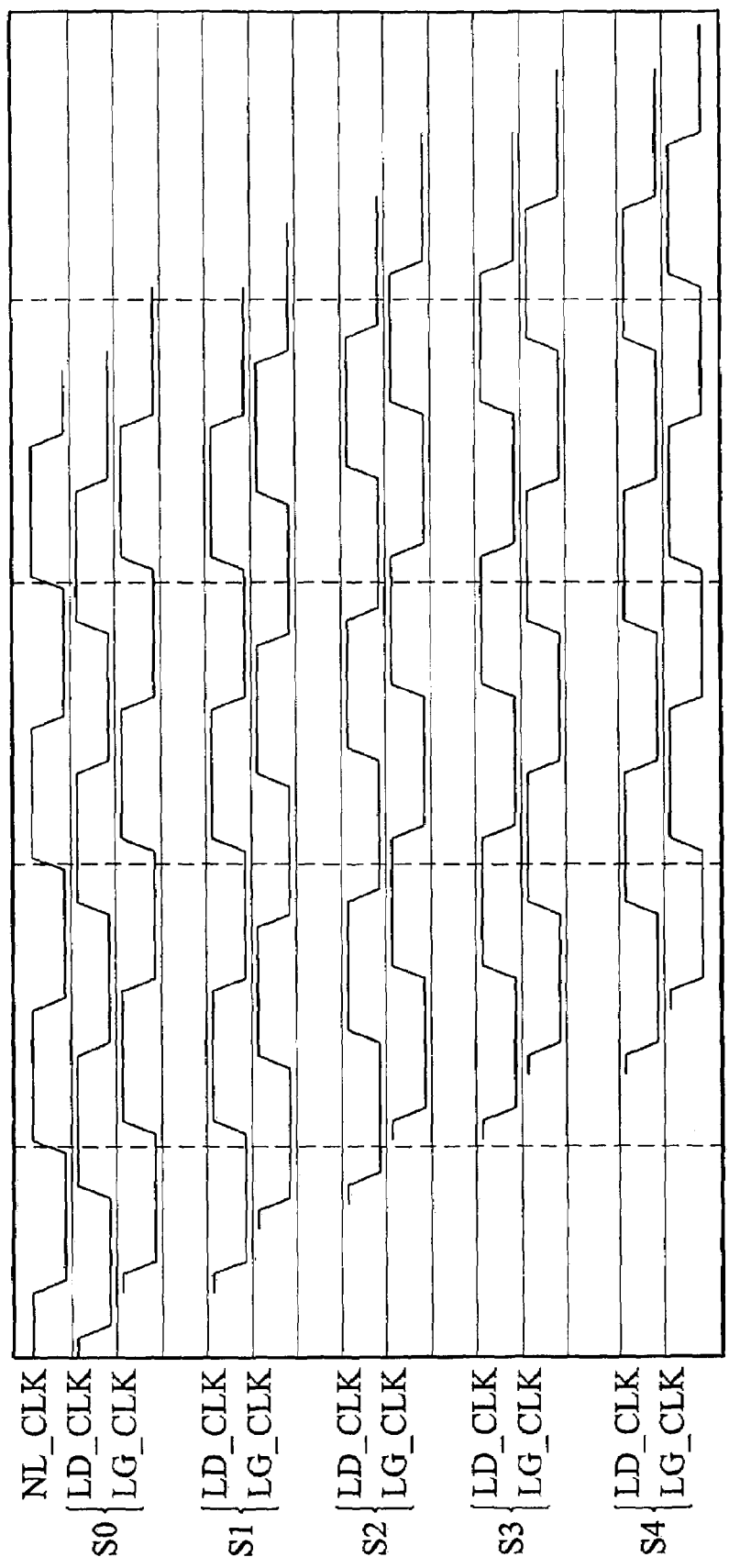
FIG. 3 is a diagram illustrating timing relationships corresponding to states in accordance with the invention.

Referring to FIG. 3, the possible timing relationships among the NL_CLK, the LD_CLK and the LG_CLK signals are illustrated. These timing relationships are respectively represented by states S1, S2, S3 and S4. As depicted, the S1 state denotes that rising edges of the NL_CLK signal fall between rising edges of the LD_CLK signal and falling edges of the LG_CLK signal. The S2 state denotes that rising edges of the NL_CLK signal fall between falling edges of the LD_CLK signal and falling edges of the LG_CLK signal. The S3 state denotes that rising edges of the NL_CLK signal fall between falling edges of the LD_CLK signal and rising edges of the LG_CLK signal. The S4 state denotes that rising edges of the NL_CLK signal fall between rising edges of the LD_CLK signal and rising edges of the LG_CLK signal. Note that there is a S0 state representing an initial state after power-up. In essence, the S0 and the S4 states both correspond to the same timing relationship. The use of the fixed delay elements 212 and 216 ensures that the control logic 202 is initialized to the S0 state after power-up or reset. As well, the minimum delay time of the adjustable delay elements 214a~214d must guarantee the above condition. When the S4 state is reached during a calibration, the adjustable delay elements 214a~214d offer the total sum of delays equal to one period of the REF_CLK. At this time, it means that each adjustable delay element has been properly calibrated with the DCS signal to provide an average amount equal to ¼ period of the REF_CLK. In other words, the S4 state is a target state of the calibration.

In one embodiment, the control logic 202 generates the DCS signal based on a state transition table as shown in TABLE 1 below.

TABLE 1

| PRESENT STATE | PRIOR STATE | PRIOR ACTION | NEXT ACTION |
|---|---|---|---|
| S0 | S0 | X | +1 |
| S1 | S0 | +1 | +1 |
| S1 | S1 | +1 | +1 |
| S1 | S4 | +1 | −1 |
| S1 | S3 | +1 | −1 |
| S1 | S1 | −1 | −1 |
| S1 | S2 | −1 | −1 |
| S2 | S0 | +1 | +1 |
| S2 | S1 | +1 | +1 |
| S2 | S2 | +1 | +1 |
| S2 | S4 | +1 | −1 |

TABLE 1-continued

| PRESENT STATE | PRIOR STATE | PRIOR ACTION | NEXT ACTION |
|---|---|---|---|
| S2 | S2 | −1 | −1 |
| S3 | S1 | +1 | +1 |
| S3 | S2 | +1 | +1 |
| S3 | S3 | +1 | +1 |
| S3 | S1 | −1 | +1 |
| S4 | S2 | +1 | +1 |
| S4 | S3 | +1 | +1 |
| S4 | S4 | +1 | HOLD |
| S4 | S2 | −1 | HOLD |
| S4 | S1 | −1 | HOLD |

The state transition table includes a set of present states, a set of prior states, a set of prior actions and a set of next actions. Each of the present states is defined by a currently received timing relationship among the NL_CLK, the LD_CLK and the LG_CLK signals, in which a present state may be the state S0, S1, S2, S3, or S4. Each of the prior states is defined by a previously received timing relationship among the NL_CLK, the LD_CLK and the LG_CLK signals, in which a prior state may be the state S0, S1, S2, S3, or S4. Each of the prior actions is indicative of a prior adjustment for the DCS signal. Notably, an 'X' in the TABLE 1 means that this entry is irrelevant. Moreover, each of the next actions is indicative of a next adjustment for the DCS signal.

The DCS signal is a 4-bit count according to the invention. For the prior and the next actions in TABLE 1, a '+1' is referred to increment the 4-bit count, and a '−1' is referred to decrement the 4-bit count. The control logic 202 determines the next action from the state transition table based on the present state, the prior state and the prior action, thereby adjusting the DCS signal. It either increments or decrements the 4-bit count as the DCS signal depending on whether the next adjustment is to count up or count down the DCS signal. In this regard, the delay calibrator 204 responsive to each adjustment of the DCS signal is designed to change two states at most for the timing relationship according to the invention. For example, a present state of S3 may transit from a prior state of S1, S2 or S3 (no change) in response to an increment action. The DCS signal is provided to calibrate the delay element 124 for the FCLK signal once the timing relationship has been adjusted to meet a predetermined condition. Except in the S0 state, the predetermined condition for the timing relationship is that rising edges of the NL_CLK signal fall between rising edges of the LD_CLK signal and rising edges of the LG_CLK signal, i.e. the target state S4. In one embodiment, each adjustable delay element in the delay calibrator 204 is substantially identical to the adjustable delay element 124.

As an example of a calibration process, the forward clock FCLK is a 100 MHz signal having a period of 10 nsec. As well, the reference clock REF_CLK is a 100 MHz signal. After system power-up, the timing relationship among the NL_CLK, the LD_CLK and the LG_CLK signals is initialized to a known state S0. The control logic 202 automatically increases the DCS signal by 1 and causes the delay calibrator 204 to adjust the LD_CLK and the LG_CLK signals in response to the increment. Then, the control logic 202 determines which state corresponds to the currently received timing relationship (the present state). If the present state transits from the prior state of S0 to the S1 state, the control logic 202 takes a next action of '+1' to increment the 4-bit count based on the present state, the prior state and the prior action. In a similar manner, the present state becomes S2 from the prior state of S1. The control logic 202 increments the DCS signal again and examines the currently received timing relationship. If the present state merely changes to the S3 state, the control logic 202 continues to increment the DCS signal. At this time, the present state remains in the S3 state. Hence, the control logic 202 attempts to increment the DCS signal. In response to this adjustment, the delay calibrator 204 further delays the LD_CLK and the LG_CLK signals. Assuming that the present state transits from the prior state of S3 over the S4 state to the S1 state, the control logic 202 decrements the DCS signal to approach the target state. In response to the decrement, the delay calibrator 204 is calibrated toward the predetermined condition. As a result, the present state transits from the prior state of S1 back to the S4 state, and it arrives at the target state finally. Thus, the automatic calibration process is terminated now, and each of the four adjustable delay elements has been adjusted to have a proper delay time of 2.5 nsec by the calibrated DCS signal. This calibrated DCS signal is provided to the adjustable delay element 124 to accurately delay the FCLK signal by an interval equal to 2.5 nsec.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An apparatus for automatic delay calibration of a forward clock, comprising:
   control logic for receiving a normal clock, a lead clock and a lag clock, and generating a delay control signal based on a timing relationship among the normal clock, the lead clock and the lag clock; and
   a delay calibrator for receiving a reference clock having the same frequency as the forward clock to provide the normal, the lead and the lag clocks as feedback to the control logic, and adjusting the lead and the lag clocks in accordance with the delay control signal;
   wherein the delay control signal is provided to perform a delay calibration for the forward clock once the timing relationship has been adjusted to meet a predetermined condition; and
   wherein the control logic includes a state transition table having a set of present states, a set of prior states, a set of prior actions and a set of next actions, each of the present states being defined by a currently received timing relationship among the normal, the lead and the lag clocks, each of the prior states being defined by a previously received timing relationship among the normal, the lead and the lag clocks, each of the prior actions being indicative of a prior adjustment for the delay control signal, and each of the next actions being indicative of a next adjustment for the delay control signal.

2. The apparatus as recited in claim 1, wherein the control logic determines the next action from the state transition table based on the present state, the prior state and the prior action, thereby adjusting the delay control signal.

3. The apparatus as recited in claim 2, wherein the control logic either increments or decrements a count as the delay control signal depending on whether the next action indicative of the next adjustment is to count up or count down the delay control signal.

4. An apparatus for automatic delay calibration of a forward clock, comprising:
   control logic for receiving a normal clock, a lead clock and a lag clock, and generating a delay control signal based on a state transition table having a set of present states, a set of prior states, a set of prior actions and a set of next actions, wherein each of the present states is defined by a currently received timing relationship among the normal, the lead and the lag clocks, each of the prior states is defined by a previously received timing relationship among the normal, the lead and the lag clocks, and wherein each of the prior actions is indicative of a prior adjustment for the delay control signal, and each of the next actions is indicative of a next adjustment for the delay control signal; and
   a delay calibrator coupled to the control logic, for receiving a reference clock having the same frequency as the forward clock to provide the normal, the lead and the lag clocks as feedback to the control logic, and adjusting the lead and the lag clocks in accordance with the delay control signal.

5. The apparatus as recited in claim 4, wherein the delay calibrator comprises:
   a first fixed delay element for delaying the reference clock as the normal clock by a first delay time;
   a plurality of adjustable delay elements connected in cascade, each having an adjustable delay time under control of the delay control signal, for delaying the reference clock as the lead clock by a sum of the adjustable delay times; and
   a second fixed delay element connected to the adjustable delay elements in cascade, for further delaying the lead clock as the lag clock by a second delay time.

6. The apparatus as recited in claim 4, wherein the control logic determines the next action from the state transition table based on the present state, the prior state and the prior action, thereby adjusting the delay control signal.

7. The apparatus as recited in claim 6, wherein the control logic either increments or decrements a count as the delay control signal depending on whether the next action indicative of the next adjustment is to count up or count down the delay control signal.

8. The apparatus as recited in claim 4, wherein the control logic provides the delay control signal to adjust the forward clock once a target state is reached, in which the target state is defined by the currently received timing relationship where rising edges of the normal clock fall between rising edges of the lead clock and rising edges of the lag clock.

9. The apparatus as recited in claim 5, wherein the total number of the adjustable delay elements is equal to N, where N is a positive integer greater than one, and when the predetermined condition is satisfied that each of the adjustable delay elements achieves a desired delay substantially equivalent to 1/N period of the forward clock.

* * * * *